(12) United States Patent
Jung et al.

(10) Patent No.: US 12,745,542 B2
(45) Date of Patent: Sep. 22, 2026

(54) DISPLAY DEVICE

(71) Applicant: Samsung Display Co., LTD., Yongin-si (KR)

(72) Inventors: Youn Hwan Jung, Yongin-si (KR); Kyu Han Bae, Yongin-si (KR); Yoon Ki Hong, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 426 days.

(21) Appl. No.: 18/406,146

(22) Filed: Jan. 6, 2024

(65) Prior Publication Data

US 2024/0414980 A1 Dec. 12, 2024

(30) Foreign Application Priority Data

Jun. 9, 2023 (KR) ........................ 10-2023-0074035

(51) Int. Cl.

*H10K 59/80* (2023.01)
*G04G 17/04* (2006.01)
*G04G 17/08* (2006.01)

(52) U.S. Cl.

CPC ......... *H10K 59/872* (2023.02); *G04G 17/045* (2013.01); *G04G 17/08* (2013.01)

(58) Field of Classification Search

None

See application file for complete search history.

(56) References Cited

U.S. PATENT DOCUMENTS 10,304,392 B2 5/2019 Eom
12,353,241 B1 * 7/2025 Kakuda .................. G06F 1/181
2019/0051858 A1 * 2/2019 Tomioka ............... G02F 1/1339
2019/0296259 A1 * 9/2019 Baek ...................... H10K 59/40

FOREIGN PATENT DOCUMENTS

CN 110290239 A 9/2019
KR 1020180093202 A 8/2018
KR 1020200082363 A 7/2020

* cited by examiner

*Primary Examiner* — Christopher J Kohlman
(74) *Attorney, Agent, or Firm* — CANTOR COLBURN LLP

(57) ABSTRACT

A display device includes: a display member; a cover window covering an upper portion of the display member and having a central portion and a curved portion; a lower cover covering a lower portion of the display member; a middle frame disposed between the cover window and the lower cover; a first coupling layer disposed between the curved portion of the cover window and the middle frame and made of an adhesive material; and a first filler filled in a space between the curved portion of the cover window and the display member, where at least a portion of the first coupling layer and the first filler overlap in a thickness direction of the display member.

20 Claims, 16 Drawing Sheets

DISPLAY DEVICE

This application claims priority to Korean Patent Application No. 10-2023-0074035 filed on Jun. 9, 2023, and all the benefits accruing therefrom under 35 U.S.C. § 119, the content of which in its entirety is herein incorporated by reference.

BACKGROUND

1. Technical Field

The present disclosure relates to a display device.

2. Description of the Related Art

The importance of a display device is increasing with the development of multimedia. Examples of such a display device include a liquid crystal display ("LCD"), an organic light emitting display ("OLED"), and the like.

In order to improve aesthetics, a flexible display device in which edge portions of the display device are bent to have a predetermined curvature has emerged. To cope with this, research on a cover window including a curved surface is being actively conducted.

SUMMARY

Aspects of the present disclosure provide a display device capable of securing a sufficient attachment area between a cover window and a middle frame while reducing a width of a bending area in a display device employing a cover window having a curved surface.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment, a display device includes: a display member; a cover window covering an upper portion of the display member and having a central portion and a curved portion: a lower cover covering a lower portion of the display member; a middle frame disposed between the cover window and the lower cover; a first coupling layer disposed between the curved portion of the cover window and the middle frame and made of an adhesive material; and a first filler filled in a space between the curved portion of the cover window and the display member, where at least a portion of the first coupling layer and the first filler overlap in a thickness direction of the display member.

The curved portion may become thinner as a distance from the central portion increases.

Wherein a slope of an outer wall of the curved portion may be steeper than a slope of an inner wall.

The first coupling layer may include a first_first coupling layer in contact with the curved portion and a first_second coupling layer that is not in contact with the curved portion.

The middle frame, the first_second coupling layer, the first filler, and the cover window may overlap in the thickness direction.

The first filler may be in contact with the first_second coupling layer, the cover window, and a side surface of the display member.

The first filler may be made of resin.

A thickness of the first filler may be smaller than a height of an inner side of the cover window.

The display member may include a display panel on which an image is displayed, and the display panel may include a bending area in which the display panel is bent.

A space the bending area of the display panel surrounds may be filled with a second filler.

The second filler may be formed of the same material as the first filler.

The second filler may be made of resin.

The middle frame may include a middle plate disposed on a rear surface of the display panel, and a middle sidewall coupled to a side surface of the middle plate to vertically support the curved portion, and the middle frame may be disposed to be spaced apart from the display panel to include an accommodating space therebetween.

The display device may further include a second coupling layer disposed between the middle frame and the lower cover and made of an adhesive material.

The cover window may have a dome shape that is convex in the thickness direction.

According to an embodiment, a display device includes: a display member; a cover window covering an upper portion of the display member and having a central portion and a curved portion: a lower cover covering a lower portion of the display member: a middle frame disposed between the cover window and the lower cover; a first coupling layer disposed between the curved portion of the cover window and the middle frame and made of an adhesive material; and a first filler filled in a space between the curved portion of the cover window and the display member, where the curved portion becomes thinner as a distance from the central portion increases.

A slope of an outer wall of the curved portion may be steeper than a slope of an inner wall.

The first filler may be in contact with the first coupling layer, the cover window, and a side surface of the display member.

The display member may include a display panel on which an image is displayed, the display panel may include a bending area in which the display panel is bent, and a space the bending area of the display panel surrounds may be filled with a second filler.

The cover window may have a dome shape that is convex in a thickness direction of the display member.

According to the display device according to an embodiment of the present disclosure, the sufficient attachment area between the cover window and the middle frame may be secured while reducing the width of the bending area.

According to the display device according to an embodiment of the present disclosure, an impact protection function may be effectively enhanced by a filler.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which:

FIG. 3 is a plan view of a rear surface of the body portion:

FIGS. 8 to 10 are cross-sectional views illustrating a portion of a manufacturing method of a display device according to an embodiment;

FIGS. 15 and 16 are cross-sectional views of a display device according to still another embodiment.

DETAILED DESCRIPTION

Figure 1:
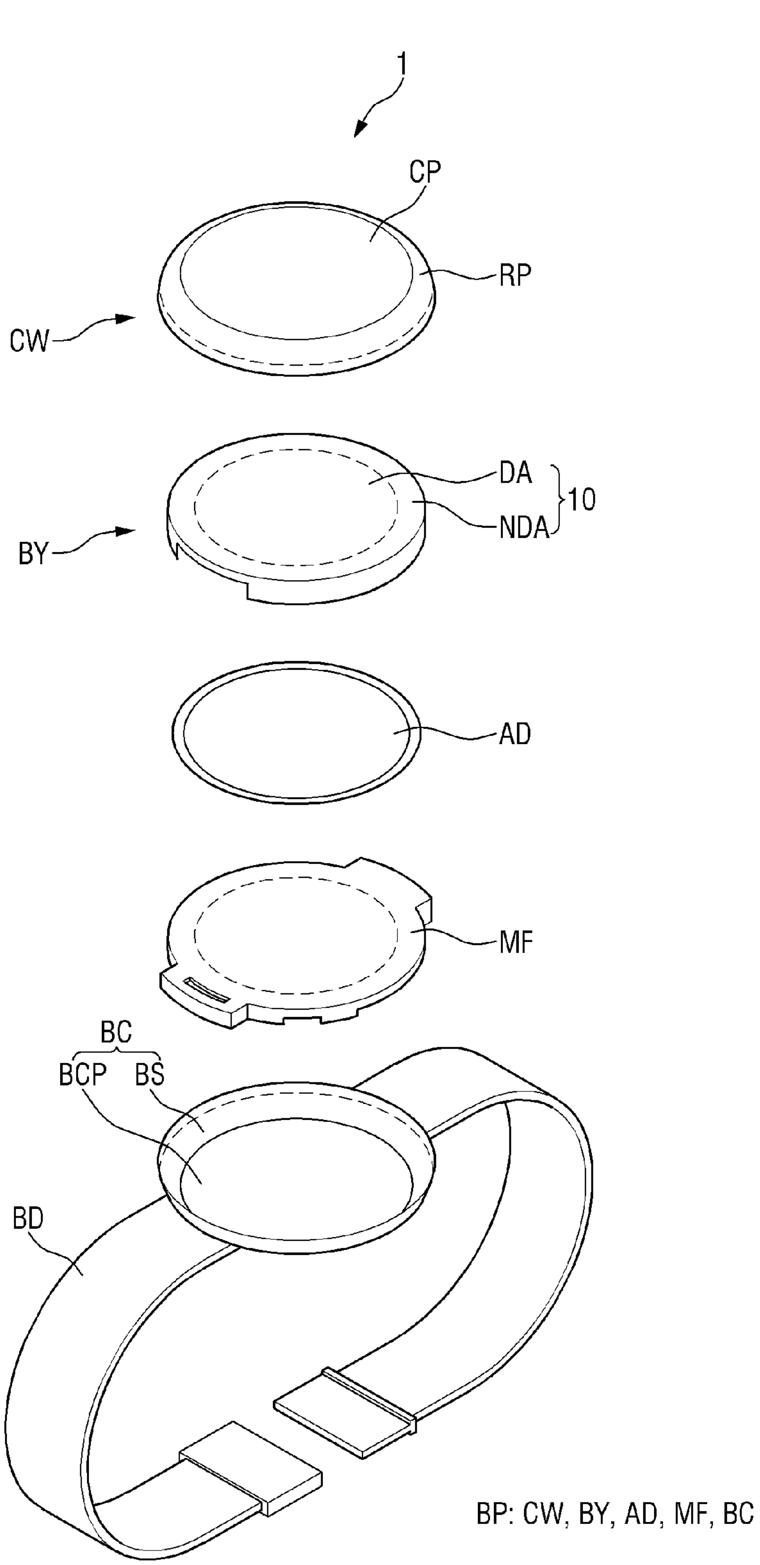
FIG. 1 is an exploded perspective view of the display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above (i.e., in a third direction DR3), and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising." "has," "have," "having." "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is an exploded perspective view of the display device according to an embodiment.

Referring to FIG. 1, a display device 1 according to an embodiment may include a body unit BP and a wearable portion BD. In the present specification, the display device 1 is illustrated as being a smart watch, but is not limited thereto. In another embodiment, the display device 1 may be various display devices 1 such as a smart phone, a television, and a computer.

The body unit BP may include a display panel 10 on which images are displayed, a cover window CW disposed on the display panel 10, a lower cover BC disposed under the display panel 10, a middle frame MF disposed between the cover window CW and the lower cover BC, and a coupling layer AD disposed between the cover window CW and the middle frame MF.

The body unit BP may include the lower cover BC, the middle frame MF, the coupling layer AD, the display panel 10, and the cover window CW that are sequentially arranged.

The display panel 10 may be a screen on which various types of information, contents, user interfaces, and the like are displayed as images. The display panel 10 may be positioned at the center of an upper surface of a body portion BY. The display panel 10 may be an organic light emitting display panel or a liquid crystal display panel, but is not limited thereto. The display panel 10 may include a display area DA where an image is displayed and a non-display area NDA positioned around the display area DA. As illustrated in FIG. 1, a planar shape of the display panel 10 may be substantially circular, but is not limited thereto and may have various shapes, such as a polygon such as a quadrangle or an elliptical shape.

The cover window CW may be disposed above the display panel 10 to protect the display panel 10 and transmit light emitted from the display panel 10. As described above, the cover window CW includes a light blocking portion to block some of the light emitted from the display panel 10. The cover window CW may be made of a transparent plastic material, a glass material, or a tempered glass material. As an example, the cover window CW may be made of any one of sapphire glass and gorilla glass or have a laminated structure thereof. As another example, the cover window CW may include any one of polyethylene terephthalate ("PET"), polycarbonate ("PC"), polyethersulfone ("PES"), polyethylene napthanate ("PEN"), and polynorbornene ("PNB"). The cover window CW may be made of tempered glass in consideration of scratch resistance and transparency.

The cover window CW may be disposed to overlap the display panel 10 and cover the entire surface of the display panel 10 in a plan view. The cover window CW generally has a shape similar to a shape of the display panel 10 in a plan view, but may have a greater size than the display panel 10. For example, the cover window CW may more protrude outward than the display panel 10. A planar shape of the cover window CW may be the same as a planar shape of the body unit BP. For example, the planar shape of the cover window CW may be substantially circular, but is not limited thereto and may have various shapes, such as a polygon such as a quadrangle or an elliptical shape.

The cover window CW may include a central portion CP and a curved portion RP disposed around the central portion CP.

The central portion CP is positioned at the center of the cover window CW and may be substantially flat. The central portion CP may be an area corresponding to the display area DA of the display panel 10. In an embodiment, the central portion CP of the cover window CW may cover the entirety of the display area DA of the display panel 10, but is not limited thereto and may also cover only a portion of the display area DA of the display panel 10 in another embodiment.

The curved portion RP may be disposed to surround the central portion CP. The curved portion RP may be a bent portion that is bent from the central portion CP. The curved portion RP may be bent from an edge of the central portion CP. In some embodiments, a portion of the curved portion RP may include a curved surface having a predetermined curvature, and other portions thereof may be flat. The degree (or angle) at which the curved portion RP is bent from the central portion CP may be an obtuse angle, but is not limited thereto and may be a right angle or an acute angle in another embodiment.

In another embodiment, the curved portion RP may include a curved surface having a predetermined curvature. The curvature of the curved portion RP may be constant for each area, but is not limited thereto and may also be different for each area in another embodiment. For example, the curved portion RP may be inclined at a first angle, for example, 120 degrees, from the central portion CP while having a curved shape. The first angle is defined by an angle between an inner surface of the central portion CP and an inner surface of the curved portion RP. Accordingly, as the curved portion RP is curved from the central portion CP in the curved shape, the curved portion RP may be expressed as a three-dimensional window or a three-dimensional side-wall window.

The middle frame MF is a coupling member for coupling the cover window CW and the lower cover BC and is disposed between the cover window CW and the lower cover BC. For example, the middle frame MF may include a bracket.

The coupling layer AD is positioned between the cover window CW and the middle frame MF, and attaches the cover window CW and the middle frame MF to each other. The coupling layer AD is coated with an adhesive material on opposite sides and may be an adhesive tape having a waterproof or dustproof function. The coupling layer AD has a certain width and is formed along an edge of the middle frame MF. Therefore, it is preferable that the shape and size of the coupling layer AD correspond to the shape and size of the middle frame MF. That is, if the middle frame MF has a circular shape, the coupling layer AD also has a circular shape, and if the middle frame MF has a quadrangular shape, the coupling layer AD also has a quadrangular shape.

In addition, the coupling layer AD may have a ring shape in which a central portion thereof is hollowed. If the certain width is too thick, the coupling layer AD is exposed to the outside of the middle frame MF, which spoils the aesthetics of the display device 1 and obstructs a user's field of view. In addition, if the certain width is too thin, adhesiveness is weakened, so that the cover window CW and the middle frame MF may be easily separated. Accordingly, the certain width may be formed in various ways according to the shape and material of the cover window CW and the middle frame MF. In practice, an optimal width that may sufficiently secure the user's field of view and sufficient adhesiveness is experimentally selected. The coupling layer AD may have a first coupling layer and a second coupling layer, and the first coupling layer and the second coupling layer will be described with reference to FIGS. 6 and 7.

The lower cover BC is a housing disposed below the display panel 10.

The lower cover BC may include a central cover portion BCP and a peripheral portion BS disposed around the central cover portion BCP.

The central cover portion BCP is positioned at the center of the lower cover BC and may be substantially flat. The central cover portion BCP may be an area corresponding to the central portion CP of the cover window CW.

The peripheral portion BS may be disposed to surround the central cover portion BCP. The peripheral portion BS may be a bent portion that is bent from the central cover portion BCP. The peripheral portion BS may be bent from an edge of the central portion CP. In some embodiments, a portion of the peripheral portion BS may include a curved surface having a predetermined curvature, and other portions thereof may be flat. The degree (or angle) at which the peripheral portion BS is bent from the central cover portion BCP may be an obtuse angle, but is not limited thereto and may be a right angle or an acute angle in another embodiment.

The lower cover BC may be disposed on the outermost rear surface of an electronic device, may include at least one of plastic, metal, and glass, and may include a color coating layer. For example, a lower cover BC according to an example may be flat glass having a transparent, translucent, or opaque color coating layer.

A lower cover BC according to another example has the same shape as the cover window CW and may include a glass material having a color coating layer. For example, the lower cover BC according to another example may have a structure symmetrical to the cover window CW with the middle frame MF interposed therebetween, and may include a transparent, translucent, or opaque color coating layer.

The wearable portion BD is a portion for fixing the body unit BP to a user's wrist, etc., and may be, for example, any one of a strap, a chain, and a bracelet.

Figure 2:
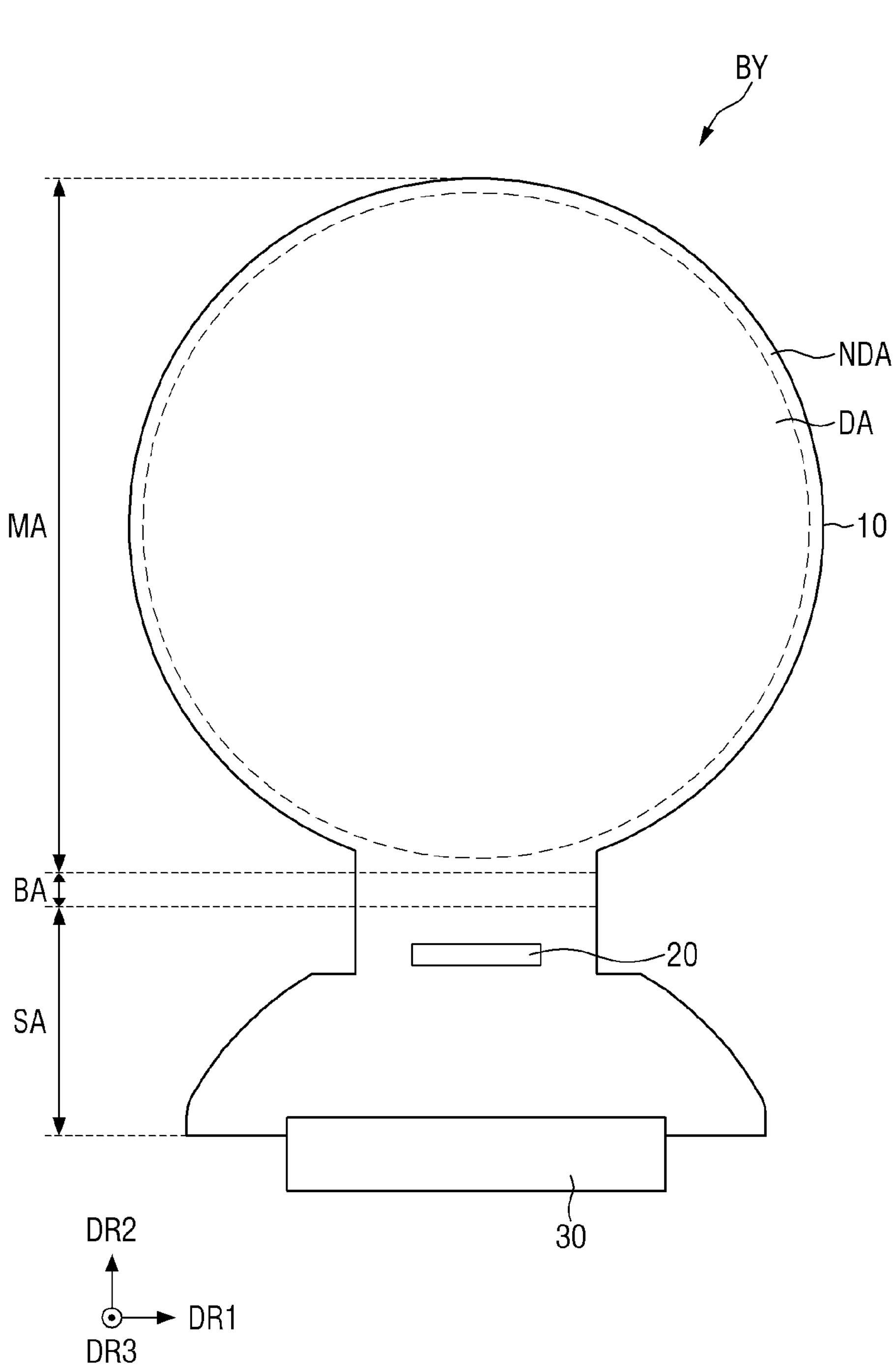
FIG. 2 is a plan view of a body portion according to an embodiment in an unfolded state.
Figure 3:
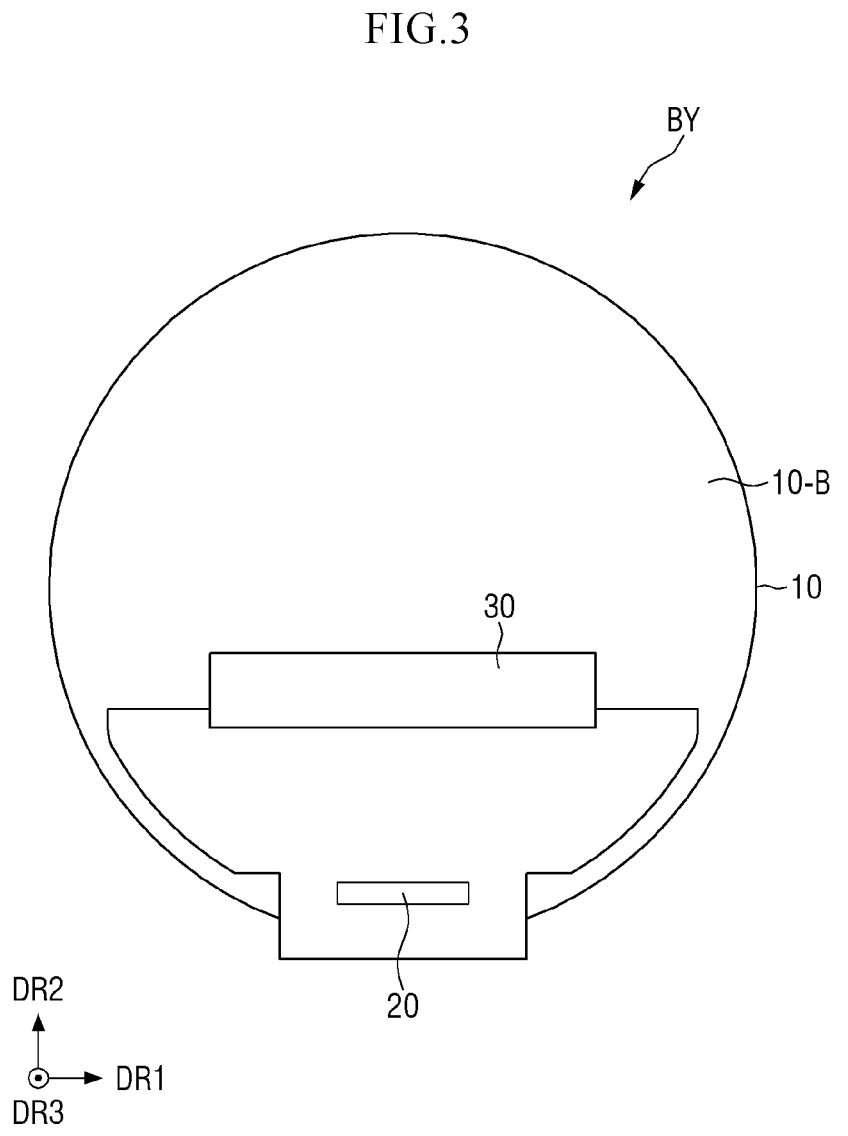
Figure 4:
FIG. 4 is a schematic partial cross-sectional view of the body portion according to an embodiment.
Figure 4:
Figure 4:
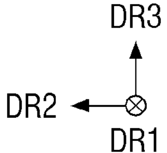

FIG. 2 is a plan view of a body portion according to an embodiment. FIG. 3 is a plan view of a rear surface of the body portion. FIG. 4 is a schematic partial cross-sectional view of the body portion according to an embodiment.

It is illustrated in FIG. 2 that the sub-area SA is unfolded without being bent. It is illustrated in FIGS. 3 and 4 that the sub-area SA is bent.

Referring to FIGS. 2 to 4, the body portion BY may include a display panel 10, a driving chip 20, and a driving substrate 30. The body portion BY may be referred to as a "display member".

Examples of the display panel 10 may include an organic light emitting display panel, a micro LED display panel, a nano LED display panel, a quantum dot light emitting display panel, a liquid crystal display panel, a plasma display panel, a field emission display panel, an electrophoretic display panel, and an electrowetting display panel. Hereinafter, a case where the organic light emitting display panel is applied as an example of the display panel will be described by way of example, but the present disclosure is not limited thereto and may be applied to other display panels as long as the same technical concept is applicable.

The display panel 10 may include a display area DA and a non-display area NDA. The display area DA may refer to a portion displaying a screen, and the non-display area NDA may refer to a portion that does not display a screen.

The display area DA may have a circular shape in a plan view. However, the present disclosure is not limited thereto, and the display area DA may have a rectangular shape in a plan view or a rectangular shape with rounded corners, or may have various shapes such as a square, other polygons, or an ellipse.

The non-display area NDA may be disposed around the display area DA. The non-display area NDA may be a bezel area. The non-display area NDA may surround the display area DA. However, the present disclosure is not limited thereto, and for another example, the non-display area NDA may not be disposed in at least a portion of the area around the display area DA.

Signal lines or driving circuits for applying signals to the display area DA (a display area or a touch area) may be disposed in the non-display area NDA. In another embodiment, the non-display area NDA may include a portion of the touch area, and a sensor member such as a pressure sensor may be disposed in the corresponding area.

The display panel 10 may include a plurality of pixels. The plurality of pixels may be arranged in a matrix direction. A shape of each pixel may be a rectangle or a square in a plan view, but is not limited thereto and may also be a rhombus shape with each side inclined with respect to a second direction DR2 or a first direction DR1 in another embodiment. Each pixel may include a light emitting area. Each light emitting area may have the same shape as a shape of the pixel or may have a different shape from the shape of the pixel. For example, when the pixel has a rectangular shape, the light emitting area of the corresponding pixel may have various shapes such as a rectangle, a rhombus, a hexagon, an octagon, and a circle.

The body portion BY may further include a touch member that senses a touch input. The touch member may be provided in the form of a touch layer TSL (see FIG. 5) on the display panel 10. In this case, the touch layer TSL (see FIG. 5) may be integrally provided with the display panel 10. However, the present disclosure is not limited thereto, and the touch member may be provided as a separate panel or film from the display panel 10 and attached to the display panel 10 in another embodiment. In the following embodiments, a case in which the touch member is provided in the form of a touch layer TSL (see FIG. 5) is described by way of example, but the present disclosure is not limited thereto.

The touch area may be an area where the touch input is sensed. The touch area may overlap the display area DA in a plan view. That is, the display area DA may be an area where a display is performed and the touch input is sensed.

The display panel 10 may include a flexible substrate including a flexible polymer material such as polyimide. Accordingly, the display panel 10 may be curved, bent, folded, or rolled.

The display panel 10 may include a bending area BA, which is an area where the display panel 10 is bent. With the bending area BA as the center of the display panel 10, the display panel 10 may be distinguished into a main area MA positioned on one side of the bending area BA in the second direction DR2 and a sub-area SA positioned on the other side (i.e., an opposite side) of the bending area BA in the second direction DR2.

A display area DA of the display panel 10 is disposed in the main area MA. In an embodiment, an area outside a peripheral edge portion of the display area DA in the main area MA, an entirety of the bending area BA, and an entirety of the sub-area SA may be the non-display area NDA. However, the present disclosure is not limited thereto, and the bending area BA and/or the sub-area SA may also include the display area DA in another embodiment.

The main area MA may have a shape substantially similar to an outer shape of the body portion BY in a plan view. The main area MA may be a flat area positioned on one plane. However, the present disclosure is not limited thereto, and at least one edge of the remaining edges other than an edge (side) of the main area MA connected to the bending area BA may be curved to form a curved surface or may be bent in a vertical direction in another embodiment.

When at least one edge of the remaining edges other than the edge (side) of the main area MA connected to the bending area BA forms a curved surface or is bent, the display area DA may also be disposed on the corresponding edge. However, the present disclosure is not limited thereto, and the curved or the bent edge may become a non-display area that does not display the screen, or a display area and a non-display area may be mixed at the corresponding portion in another embodiment.

The bending area BA is connected to the other side (i.e., the opposite side) of the main area MA in the second direction DR2. For example, the bending area BA may be connected through a lower side of the main area MA. A width of the bending area BA (a width in the first direction DR1) may be smaller than a width of the main area MA (a width in the first direction DR1) adjacent to the bending area BA. A connection portion between the main area MA and the bending area BA may have an L-shaped cut shape.

In the bending area BA, the display panel 10 may be bent with a curvature in a downward direction in the thickness direction, that is, in a direction opposite to a display surface. The bending area BA may have a constant radius of curvature, but is not limited thereto and may also have different radii of curvature for each section in another embodiment. As the display panel 10 is bent in the bending area BA, a surface of the display panel 10 is inverted. That is, one surface of the display panel 10 facing an upper side may be changed to face an outside through the bending area BA and then to face a lower side again.

The sub-area SA extends from the bending area BA. The sub-area SA may extend in a direction parallel to the main area MA starting after bending is completed. The sub-area SA may overlap the main area MA in the thickness direction (i.e., third direction DR3) of the display panel 10 (or the body portion BY). A width of the sub-area SA (a width in the first direction DR1) may increase as a distance from the bending area BA increases, but is not limited thereto.

The driving chip 20 may be disposed in the sub-area SA. The driving chip 20 may include an integrated circuit that drives the display panel 10. The integrated circuit may include an integrated circuit for a display and/or an integrated circuit for a touch unit. However, the present disclosure is not limited thereto, and the integrated circuit for the display and the integrated circuit for the touch unit may be provided as separate chips or integrated into one chip in another embodiment.

A pad portion may be disposed at an end of the sub-area SA of the display panel 10. The pad portion may include a plurality of display signal wiring pads and touch signal wiring pads. The driving substrate 30 may be connected to the pad portion at the end of the sub-area SA of the display panel 10. The driving substrate 30 may be a flexible printed circuit board or a film.

Figure 5:
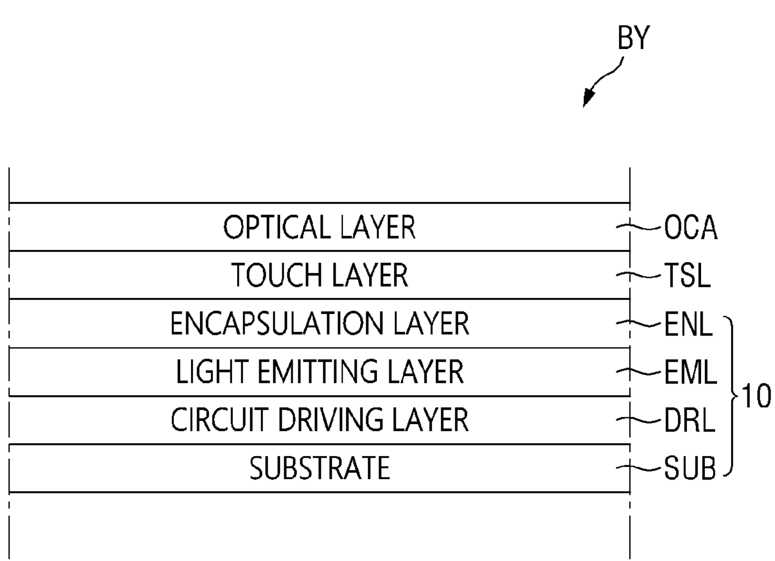
FIG. 5 is a schematic cross-sectional view illustrating an example of a stacked structure of the body portion according to an embodiment.

FIG. 5 is a schematic cross-sectional view illustrating an example of a stacked structure of the body portion according to an embodiment.

Referring to FIG. 5, the body portion BY may include a substrate SUB, a circuit driving layer DRL, a light emitting layer EML, an encapsulation layer ENL, a touch layer TSL, and an optical layer OCA that are sequentially stacked. The display panel 10 may include the substrate SUB, the circuit driving layer DRL, the light emitting layer EML, and the encapsulation layer ENL.

The substrate SUB may support components disposed thereon.

The circuit driving layer DRL may be disposed on the substrate SUB. The circuit driving layer DRL may include a circuit for driving the light emitting layer EML of the pixel. The circuit driving layer DRL may include a plurality of thin film transistors. The light emitting layer EML may be disposed on the circuit driving layer DRL.

The light emitting layer EML may include an organic light emitting layer. The light emitting layer EML may emit light with various types of luminance according to a driving signal transmitted from the circuit driving layer DRL.

The encapsulation layer ENL may be disposed on the light emitting layer EML. The encapsulation layer ENL may include an inorganic film or a stacked layer of an inorganic film and an organic film. As another example, glass or an encapsulation film may also be applied as the encapsulation layer ENL.

The touch layer TSL may be disposed on the encapsulation layer ENL. The touch layer TSL, which is a layer that recognizes a touch input, may function as a touch member. The touch layer TSL may include a plurality of sensing areas and sensing electrodes.

The optical layer OCA may be disposed on the touch layer TSL. The optical layer OCA may serve to reduce reflection of external light. The optical layer OCA may be attached in the form of a polarizing film. In this case, the optical layer OCA polarizes light passing therethrough, and the optical layer OCA may be attached to an upper portion of the touch layer TSL through an adhesive layer. The optical layer OCA in the form of a polarizing film may also be omitted. The optical layer OCA may serve to reduce reflection of external light.

However, the present disclosure is not limited thereto, and the optical layer OCA may also be stacked in the form of a color filter layer in another embodiment. In this case, the antireflection layer RPL may include a color filter or the like that selectively transmits light of a specific wavelength.

Figure 6:
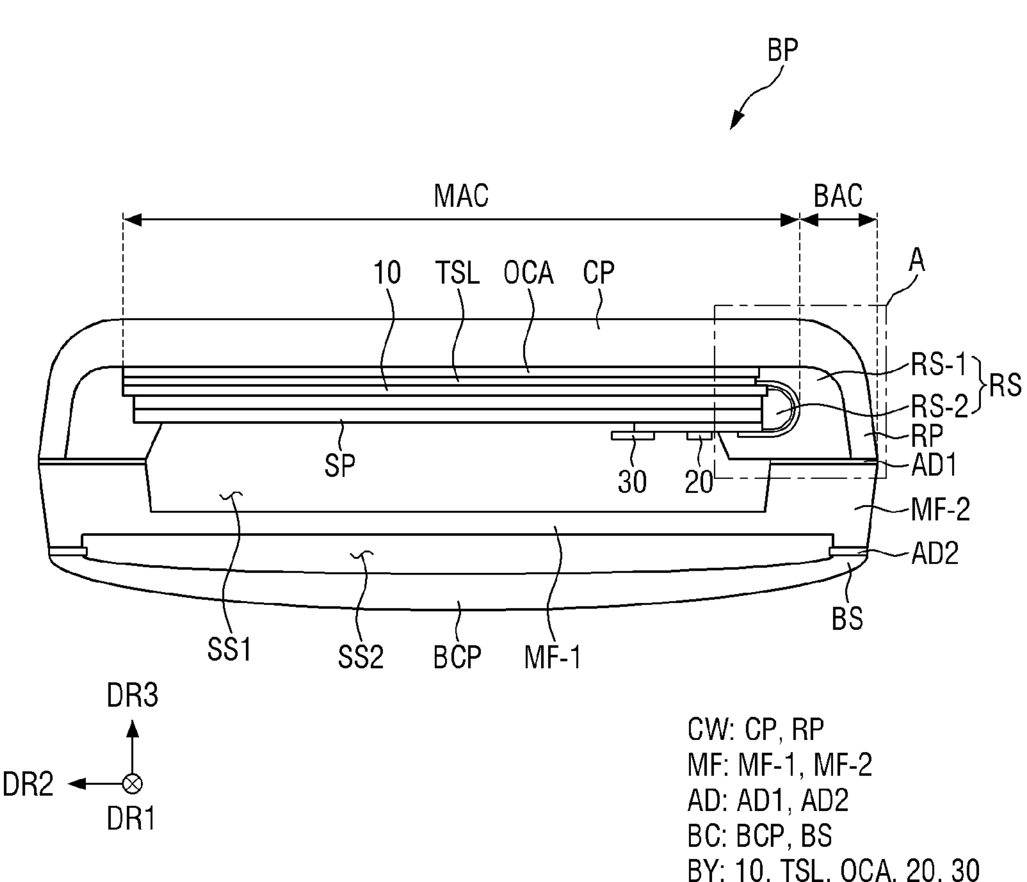
FIG. 6 is a schematic cross-sectional view of the display device according to an embodiment.
Figure 7:
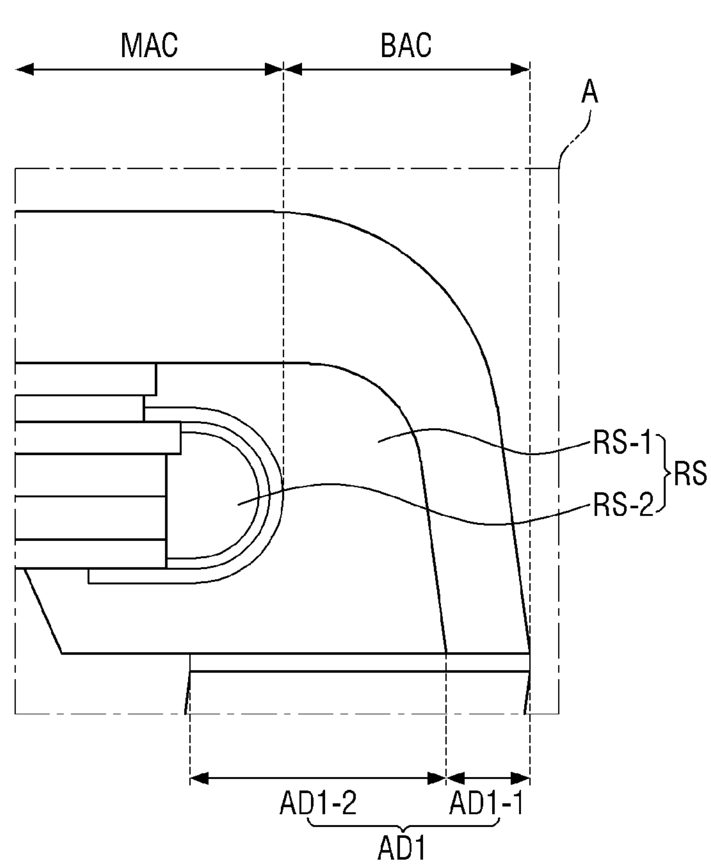
FIG. 7 is an enlarged view of area A of FIG. 6.

FIG. 6 is a schematic cross-sectional view of the display device according to an embodiment and FIG. 7 is an enlarged view of area A of FIG. 6.

The body unit BP includes the lower cover BC, the middle frame MF, the coupling layer AD, the display panel 10, and the cover window CW as described with reference to FIG. 1. In addition, referring to FIGS. 6 and 7, the body unit BP may further include a filler RS and a support layer SP. The cover window CW may include a main area MAC and a bending area BAC. The main area MAC of the cover window CW is an area overlapping the body portion BY in a plan view, and the bending area BAC of the cover window CW is an area surrounding the main area MAC and including the curved portion RP. Since the lower cover BC, the coupling layer AD, the display panel 10, and the cover window CW have been described with reference to FIG. 1, detailed descriptions thereof will be omitted. However, a detailed structure of the middle frame MF will be described with reference to FIG. 6.

The middle frame MF may serve as a bracket for fixing the cover window CW and the lower cover BC.

The display panel 10 is disposed between the middle frame MF and the cover window CW. A rear surface of the display panel 10 and an upper surface of the middle frame MF face each other, but are disposed to be spaced apart from each other to provide a first accommodating space SS1 therebetween. The first accommodating space SS1 may accommodate peripheral circuits of an electronic device, such as a host driving system, a memory, and a battery.

The middle frame MF may include a middle plate MF-1 and a middle sidewall MF-2.

The middle plate MF-1 may be disposed on the rear surface of the display panel 10. In this case, the middle plate MF-1 may include at least one open portion through which a cable for electrical connection between a display driving circuit portion and the host driving system connected to the display panel 10 passes, at least one concave portion in which various electronic circuit components mounted in the electronic device are disposed, and the like.

The middle sidewall MF-2 is vertically coupled to a side surface of the middle plate MF-1 to support the curved portion RP of the cover window CW. For example, the middle sidewall MF-2 may be coupled to the curved portion RP of the cover window CW through the first coupling layer AD1, and in this case, a waterproof performance of the electronic device may be improved and a permeation of foreign substances may be prevented. Like the coupling layer AD described with reference to FIG. 1, the first coupling layer AD1 has a certain width and may be formed along an edge of the surface of the middle frame MF. The width of the first coupling layer AD1 may be about 1 millimeter (mm) to 8 mm, but may be wider than a thickness of the curved portion RP.

The first coupling layer AD1 is coated with an adhesive material on opposite sides and may be an adhesive tape having a waterproof or dustproof function.

Referring to FIG. 7, the first coupling layer AD1 may include a first_first coupling layer AD1-1 and a first_second coupling layer AD1-2. The first_first coupling layer AD1-1 is disposed between the curved portion RP of the cover window CW and the middle sidewall MF-2 to couple the curved portion RP of the cover window CW and the middle sidewall MF-2. Accordingly, in the body unit BP, the middle sidewall MF-2, the first_first coupling layer AD1-1, and the curved portion RP of the cover window CW are sequentially disposed in the third direction DR3. A width of the first_first coupling layer AD1-1 varies according to a width of the curved portion RP of the cover window CW.

The first_second coupling layer AD1-2 is disposed between a first filler RS-1 and the middle sidewall MF-2 to couple the first filler RS-1 and the middle sidewall MF-2. Accordingly, in the body unit BP, the middle sidewall MF-2, the first_second coupling layer AD1-2, the first filler RS-1, and the curved portion RP of the cover window CW are sequentially disposed in the third direction DR3. The first_second coupling layer AD1-2 may be disposed inward more than the first_first coupling layer AD1-1.

The first_first coupling layer AD1-1 is disposed between the curved portion RP of the cover window CW and the middle sidewall MF-2 to couple the curved portion RP of the cover window CW and the middle sidewall MF-2. Accordingly, in the body unit BP, the middle sidewall MF-2, the first_first coupling layer AD1-1, and the curved portion RP of the cover window CW are sequentially disposed in the third direction DR3. A width of the first_first coupling layer AD1-1 varies according to a width of the curved portion RP of the cover window CW.

The middle sidewall MF-2 is vertically coupled to a side surface of the middle plate MF-1 to support the peripheral portion BS of the cover window CW. For example, the middle sidewall MF-2 may be coupled to the peripheral portion BS of the cover window CW through the second coupling layer AD2, and in this case, a waterproof performance of the electronic device may be improved and a permeation of foreign substances may be prevented.

Like the first coupling layer AD1, the second coupling layer AD2 has a certain width and may be formed along an edge of the lower surface of the middle frame MF. The second coupling layer AD2 may be made of the same material as the first coupling layer AD1, but is not limited thereto. The second coupling layer AD2 is coated with an adhesive material on opposite sides and may be an adhesive tape having a waterproof or dustproof function in another embodiment.

A distance from one end of the display panel 10 to the curved portion RP may be about 1.5 mm to 2.0 mm, and a thickness of the curved portion RP in the second direction DR2 may be about 1.0 mm to 1.5 mm. For example, the distance from one end of the display panel 10 to the curved portion RP may be about 1.84 mm, and the thickness of the curved portion RP in the second direction DR2 may be about 1.2 mm.

The lower cover BC is coupled to the middle sidewall MF-2 so as to face the rear surface of the middle frame MF, thereby covering the rear surface (or back surface) of the middle frame MF and providing a second accommodating space SS2 on the rear surface of the middle frame MF. The second accommodating space SS2 may be provided between the middle plate MF-1 of the middle frame MF and the lower cover BC, thereby accommodating peripheral circuits of the electronic device not disposed in the first accommodating space SS1. The lower cover BC may be detachably coupled to the middle sidewall MF-2 for battery replacement according to battery discharge during use of the electronic device, for example, or may be coupled to the middle sidewall MF-2 so as to be detachable only when the electronic device is disassembled for repair. In order to detachably couple the lower cover BC and the middle sidewall MF-2, the second coupling layer AD2 may be omitted and mechanical coupling may be employed.

Meanwhile, the filler RS may be made of an ultraviolet light curing resin. In some embodiments, the filler RS may be made of an optical clear resin ("OCR").

The filler RS may include a first filler RS-1 and a second filler RS-2. The first filler RS-1 and the second filler RS-2 may be formed of or include the same material.

The first filler RS-1 may be positioned between the curved portion RP of the cover window CW and the body portion BY to couple the cover window CW and the body portion BY.

The first filler RS-1 may be formed to fill a space between the curved portion RP of the cover window CW and the body portion BY. The first filler RS-1 is in contact with the curved portion RP, the body portion BY, and the first coupling layer AD1.

On the curved portion RP of the cover window CW, the middle frame MF, the first coupling layer AD1, the first filler RS-1, and the cover window CW may be sequentially disposed in the thickness direction. That is, the first filler RS-1 is disposed on the first coupling layer AD1, and an attachment area may be expanded by the first coupling layer AD1 and the first filler RS-1. In addition, an impact protection function may be enhanced by the first filler RS-1.

The second filler RS-2 may be formed to fill an entire space formed by the bending area BA of the display panel 10. The second filler RS-2 may maintain a bent state of the display panel 10. The second filler RS-2 may be formed of or include the same material as the first filler RS-1. The second filler RS-2 may be made of an ultraviolet light curing resin. In some embodiments, the second filler RS-2 may be made of an optical clear resin (OCR). The second filler RS-2 may be initially applied to the rear surface of the display panel 10 in a liquid or paste state, and may be cured by ultraviolet light ("UV") after the display panel 10 is bent.

The support layer SP may prevent the display panel 10 from being bent by an external force or reduce the degree of bending of the display panel 10. The support layer SP may maintain the display panel 10 in a relatively flat state even when an external force is applied.

The support layer SP may include a rigid or semi-rigid material. Specifically, the support layer SP may include a metal material such as stainless steel ("SUS") or aluminum, a polymer such as polymethyl methacrylate ("PMMA"), polycarbonate ("PC"), polyvinyl alcohol ("PVA"), acrylonitrile-butadiene-styrene ("ABS"), or polyethylene terephthalate (PET), or the like.

Figure 8:
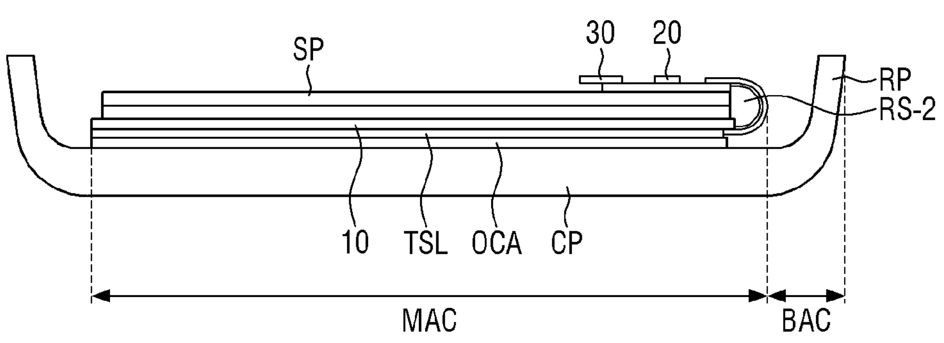
Figure 9:
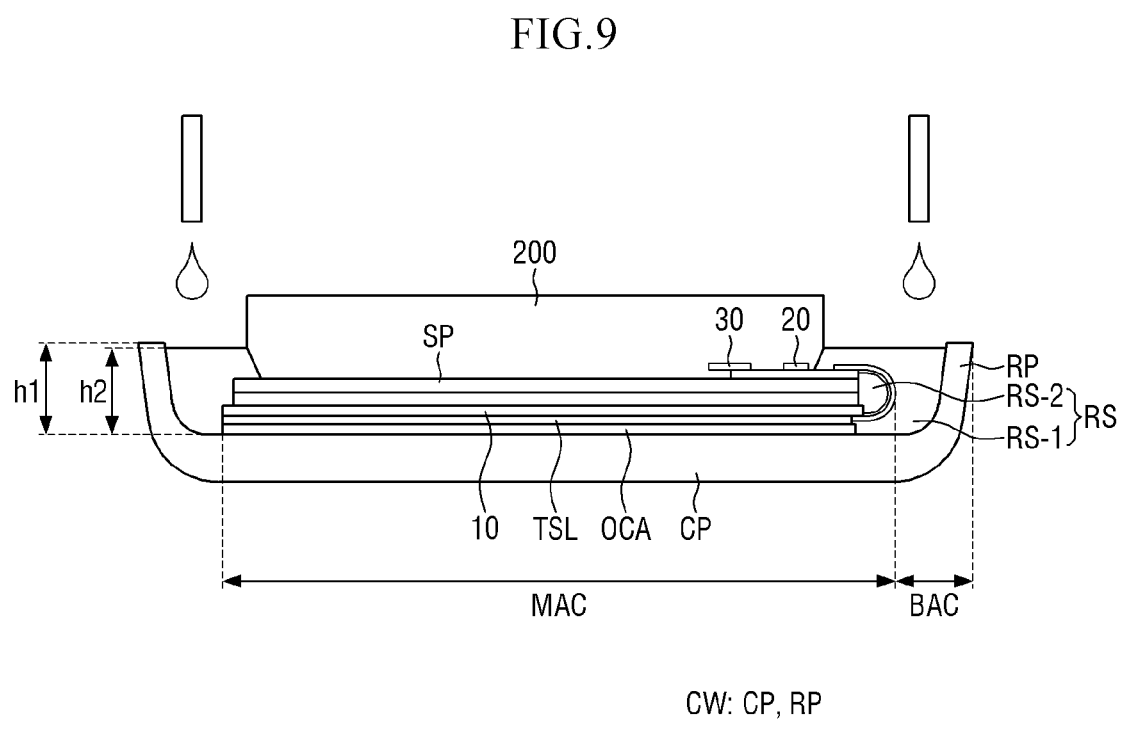
Figure 10:
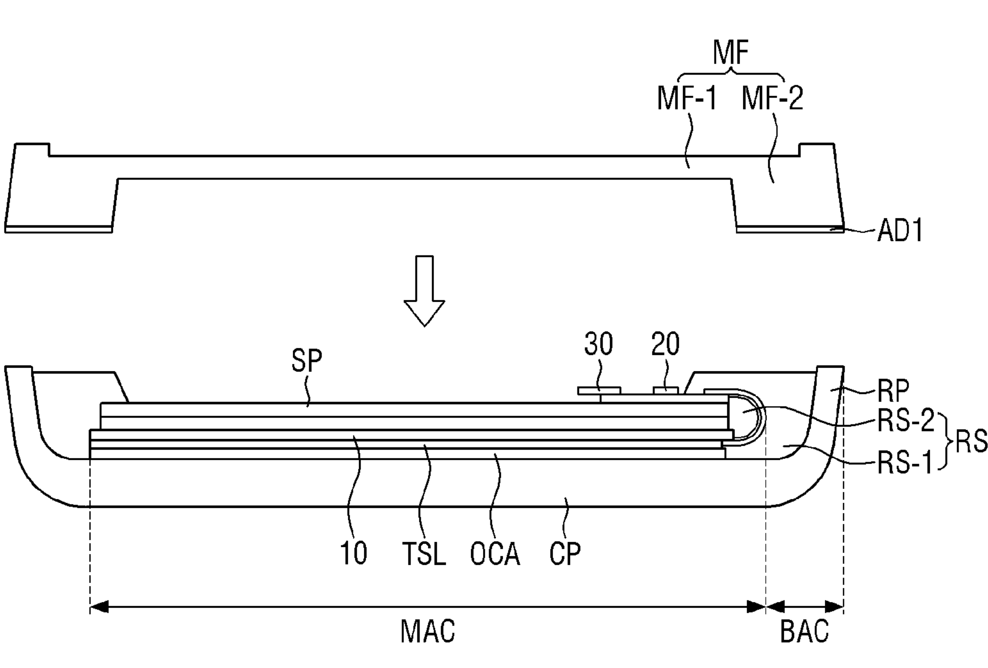

FIGS. 8 to 10 are cross-sectional views illustrating a portion of a manufacturing method of a display device according to an embodiment.

Referring to FIG. 8, the body portion BY disposed in the cover window CW is prepared.

In the body portion BY, the display panel 10 is maintained in a bent state by the second filler RS-1.

Thereafter, referring to FIG. 9, a jig 200 is disposed on the body portion BY disposed in the cover window CW, and the inside of the cover window CW in which the jig 200 is not disposed is filled with the first filler RS-1.

Here, the jig 200 may serve to form an outline of the first filler RS-1.

The jig 200 is disposed on the rear surface of the display panel 10.

The first filler RS-1 is initially applied in a liquid or paste state in the cover window CW in which the jig 200 and the body portion BY are disposed.

Thereafter, referring to FIG. 10, after the middle frame MF having the first coupling layer AD1 is stacked, the first filler RS-1 may be cured by ultraviolet light (UV).

In this case, the first filler RS-1 may be applied to be lower than the curved portion RP of the cover window CW. For example, a thickness h2 of the first filler RS-1 may be lower than an inner height h1 of the cover window CW. Thus, when the middle frame MF is stacked on the first filler RS-1, it is possible to prevent the first filler RS-1 from leaking or being visually recognized between the curved portion RP of the cover window CW and the middle sidewall MF-2 of the middle frame MF. Here, the inner height h1 of the cover window CW refers to a vertical distance from an inner surface of the central portion CP of the cover window CW to an upper surface of the curved portion RP as shown in FIG. 9. The thickness h2 of the first filler RS-1 refers to a vertical distance from one surface (i.e., top surface) to the other surface (i.e., bottom surface) of the first filler RS-1 in contact with the inner surface of the central portion CP of the cover window CW.

Figure 11:
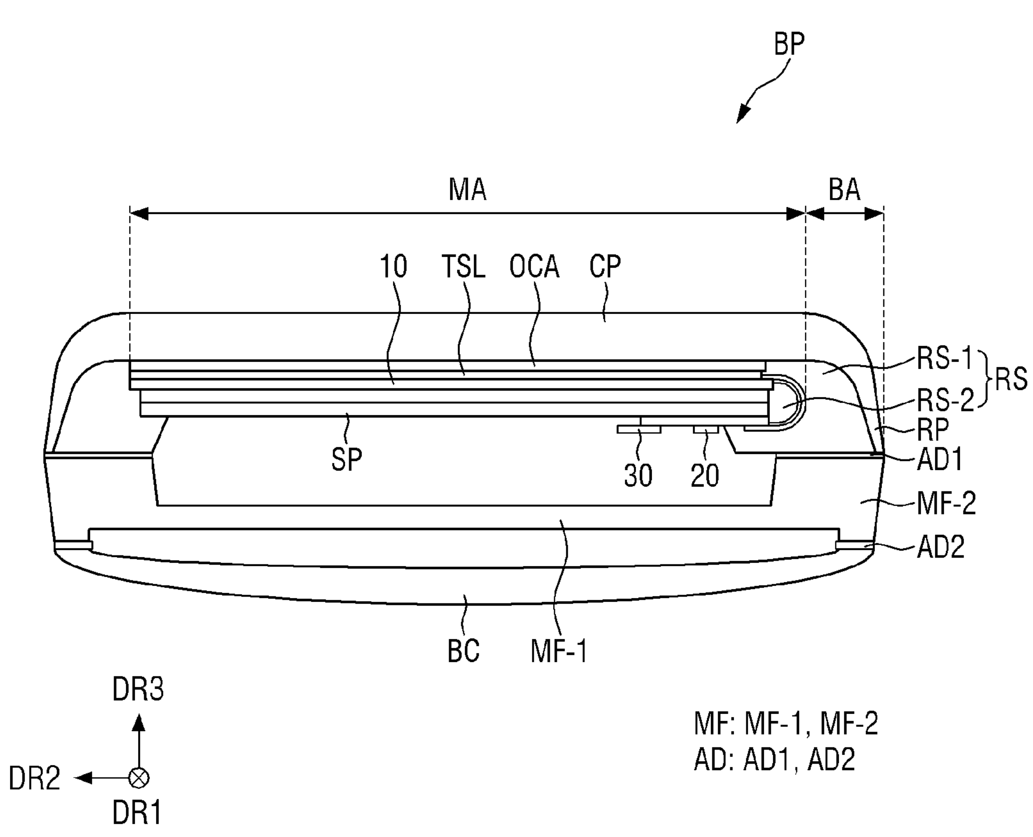
FIG. 11 is a schematic cross-sectional view illustrating a display device according to another embodiment.
Figure 12:
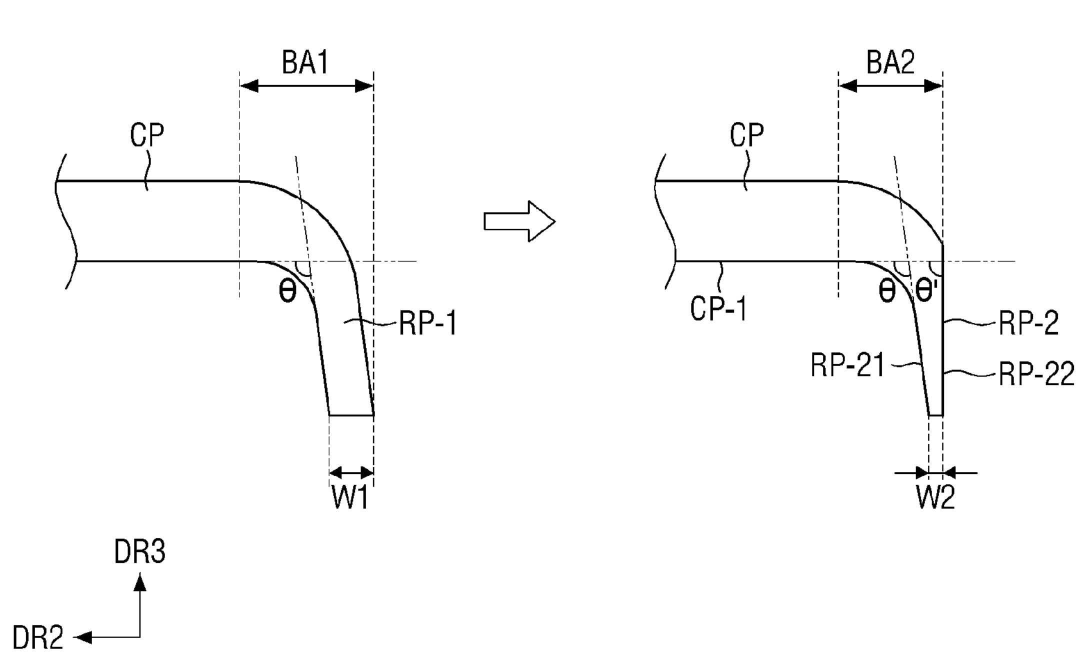
FIG. 12 is an enlarged view illustrating curved portions of cover windows of FIGS. 6 and 11.

FIG. 11 is a schematic cross-sectional view illustrating a display device according to another embodiment and FIG. 12 is an enlarged view illustrating a curved portion of a cover window of FIG. 11.

A display device of FIG. 11 is different from the display device according to the embodiment described above with reference to FIGS. 6 and 7 in that the width of the curved portion RP of the cover window CW becomes narrower toward the middle sidewall MF-2. Hereinafter, differences from those of FIGS. 6 and 7 will be mainly described with reference to FIGS. 11 and 12.

More specifically, the cover window CW may include a central portion CP and a curved portion RP disposed around the central portion CP.

The central portion CP is positioned at the center of the cover window CW and may be substantially flat. The central portion CP may be an area corresponding to the display area DA of the display panel 10. The curved portion RP may be disposed to surround the central portion CP. The curved portion RP may be a bent portion that is bent from the central portion CP. The curved portion RP may be bent from an edge of the central portion CP. In some embodiments, a portion of the curved portion RP may include a curved surface having a predetermined curvature, and other portions thereof may be flat. The degree (or angle) at which the curved portion RP is bent from the central portion CP may be an obtuse angle, but is not limited thereto and may be a right angle or an acute angle in another embodiment.

The middle sidewall MF-2 is vertically coupled to a side surface of the middle plate MF-1 to support the curved portion RP of the cover window CW. For example, the middle sidewall MF-2 may be coupled to the curved portion RP of the cover window CW through the first coupling layer AD1, and in this case, a waterproof performance of the electronic device may be improved and a permeation of foreign substances may be prevented. Like the coupling layer AD described with reference to FIG. 1, the first coupling layer AD1 has a certain width and may be formed along an edge of the surface of the middle frame MF. The width of the first coupling layer AD1 may be about 1 mm to 8 mm, but may be wider than a thickness of the curved portion RP.

Referring to FIG. 12, the curved portion RP of FIG. 11 will be compared with the curved portion RP of FIG. 6 for description. For convenience of explanation, the curved portion RP according to FIG. 11 is referred to as a curved portion RP-2, and the curved portion RP according to FIG. 6 is referred to as a curved portion RP-1.

The curved portions RP-1 and RP-2 may be inclined at a first angle, for example, 120 degrees from the central portion CP (i.e., from the inner surface CP-1 of the central portion CP) while having a curved shape. Accordingly, the curved portions RP-1 and RP-2 may be far away from the central portion CP (in a direction opposite to the second direction DR2) in a direction opposite to the third direction DR3. That is, as the curved portions RP-1 and RP-2 are bent and extended more from the central portion CP, the curved portions RP-1 and RP-2 may have a wider bending area BAC in a horizontal direction (e.g., a direction perpendicular to the third direction DR3).

An inclination angle θ of an inner wall RP-21 of the curved portion RP-2 and an inclination angle θ' of an outer wall RP-22 of the curved portion RP-2 with respect to the inner surface CP-1 of the central portion CP may be different from each other. For example, a slope of the outer wall RP-22 of the curved portion RP-2 may be steeper than a slope of the inner wall RP-21 thereof. The inclination angle θ of the inner wall RP-21 of the curved portion RP-2 may be greater than the inclination angle θ' of the outer wall RP-22 of the curved portion RP-2. In other words, the inclination angle θ' of the outer wall RP-22 of the curved portion RP-2 is closer to 90° with respect to the inner surface CP-1 of the central portion CP than the inclination angle θ of the inner wall RP-21 of the curved portion RP-2.

The inclination angle θ of the inner wall RP-21 of the curved portion RP-2 may be defined as an angle between the inner surface CP-1 of the central portion CP and the inner wall RP-21 of the curved portion RP-2, and the inclination angle θ' of the outer wall RP-22 of the curved portion RP-2 may be defined as an angle between the inner surface CP-1 of the central portion CP and the outer wall RP-22 of the curved portion RP-2.

Accordingly, the width of the bending area BAC in the horizontal direction may be reduced by forming the width (also referred to as a thickness) of the curved portion RP-2 in the horizontal direction to be narrower.

For example, comparing a case where the width of the curved portion RP-1 is formed to be constant and a case where the width of the curved portion RP-2 is gradually reduced, a width BA2 of the bending area BAC corresponding to the curved portion RP-2 may be narrower than a width BA1 of the bending area BAC corresponding to the curved portion RP-1 on the same line. The width W1 of the curved portion RP-1 in the horizontal direction may be about 1.0 mm to about 1.5 mm, and the width BA1 of the bending area BAC including the curved portion RP-1 may be about 2.5 mm to about 3.5 mm. For example, the width W1 of the curved portion RP-1 may be 1.2 mm, and the width BA1 of the bending area BAC may be 3.24 mm, but is not limited thereto. In addition, the width W2 of the curved portion RP-2 at the distal end of the curved portion RP-2 may be about 0.2 mm to about 0.8 mm, and the width BA2 of the bending area BAC including to the curved portion RP-2 may be about 1.7 mm to about 2.8 mm. For example, the width W2 of the curved portion RP-2 may be 0.3 mm, and the width BA2 of the bending area BAC may be 2.14 mm, but is not limited thereto.

A distance from one end to the curved portion RP may be 1.84 mm, and a thickness of the curved portion RP in the second direction DR2 may be 1.2 mm.

The distance from one end of the display panel 10 to the curved portion RP may be about 1.5 mm to 2.0 mm, and the thickness of the curved portion RP in the second direction DR2 may be about 1.0 mm to 1.5 mm. For example, the distance from one end of the display panel 10 to the curved portion RP may be about 1.84 mm, and the thickness of the curved portion RP in the second direction DR2 may be about 1.2 mm.

Figure 13:
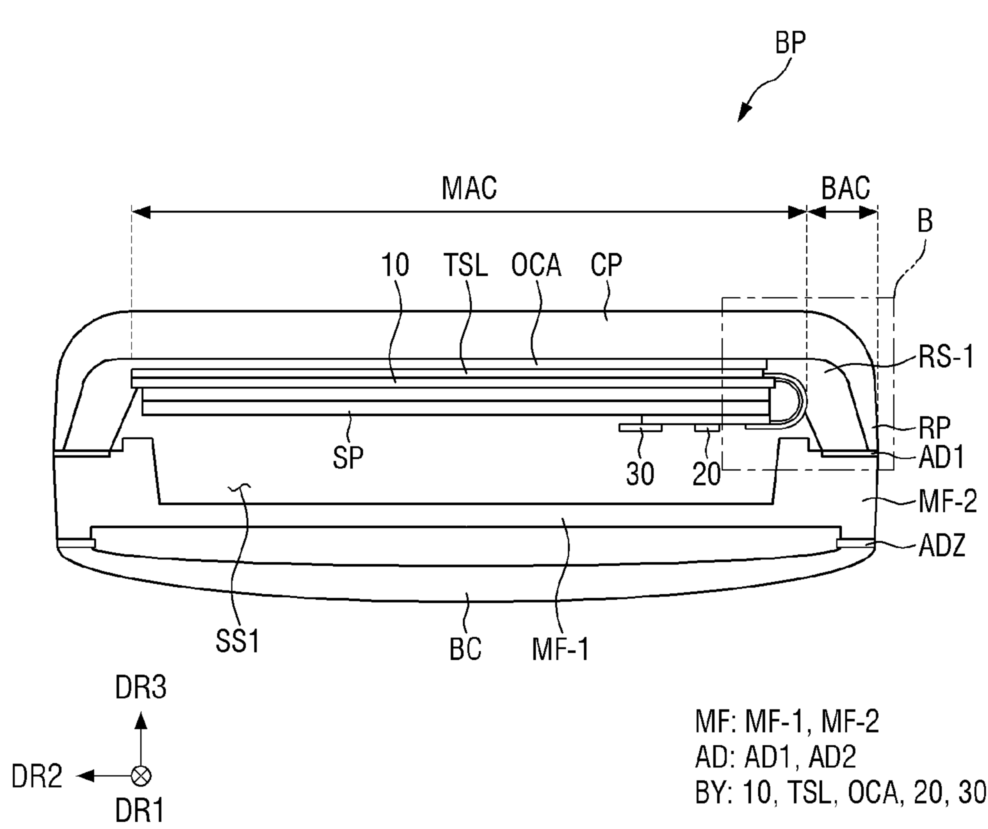
FIG. 13 is a schematic cross-sectional view illustrating a display device according to still another embodiment.
Figure 14:
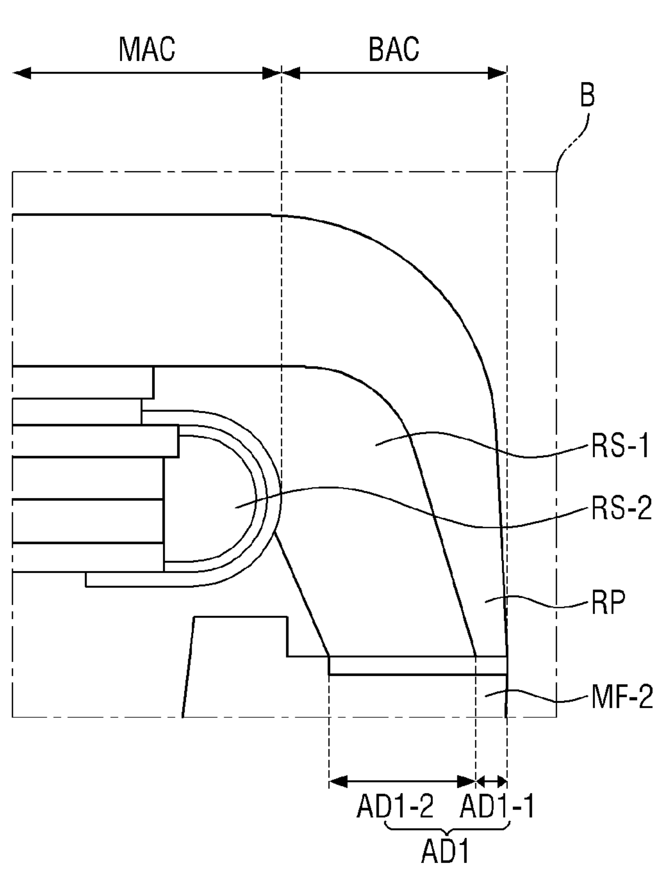
FIG. 14 is an enlarged view of area B of FIG. 13.

FIG. 13 is a schematic cross-sectional view of a display device according to another embodiment and FIG. 14 is an enlarged view of area B of FIG. 13.

A display device according to an embodiment of FIG. 13 is different from the display device according to the embodiment described above with reference to FIG. 11 in that the first filler RS-1 is formed to be narrower than the width of the middle sidewall MF-2. Hereinafter, differences from those of FIG. 11 will be mainly described with reference to FIGS. 13 and 14.

The first filler RS-1 may be positioned between the curved portion RP of the cover window CW and the body portion BY to couple the cover window CW and the body portion BY.

The first filler RS-1 may be formed to fill a space between the curved portion RP of the cover window CW and the body portion BY. In this case, the width RS-1 of the first filling material RS-1 may not deviate from the width of the middle sidewall MF-2. The first filler RS-1 may be formed so as not to overflow the middle sidewall MF-2. Accordingly, the first filler RS-1 may not invade the first accommodating space SS1, but is not limited thereto.

The first coupling layer AD1 may include a first_first coupling layer AD1-1 and a first_second coupling layer AD1-2. The first_first coupling layer AD1-1 is bonded between the curved portion RP of the cover window CW and the middle sidewall MF-2.

The first_second coupling layer AD1-2 is bonded between the first filler RS-1 and the middle sidewall MF-2. The first_second coupling layer AD1-2 may be disposed inward more than the first_first coupling layer AD1-1.

Therefore, an attachment area by the first coupling layer AD1 includes a contact area with the curved portion RP of the cover window CW and a contact area with the first filler RS-1. Accordingly, even when the width of the curved portion RP of the cover window CW is narrowed, the attachment area by the first coupling layer AD1 may be sufficiently secured.

Figure 15:
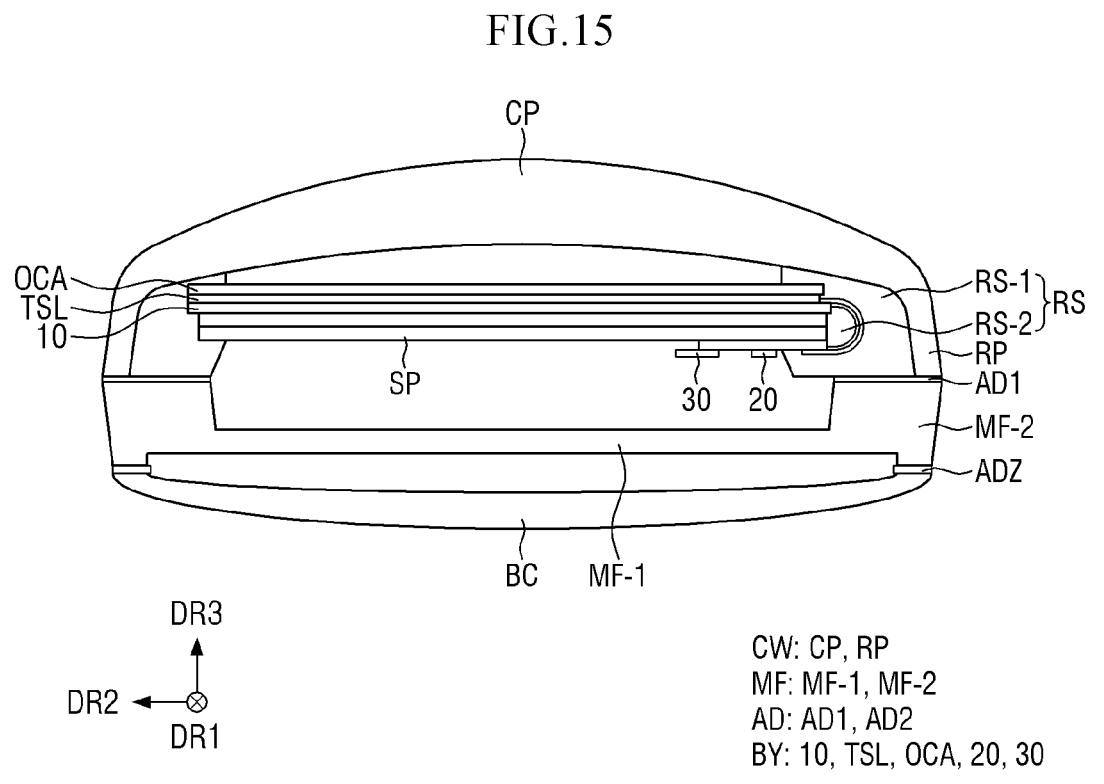
Figure 16:
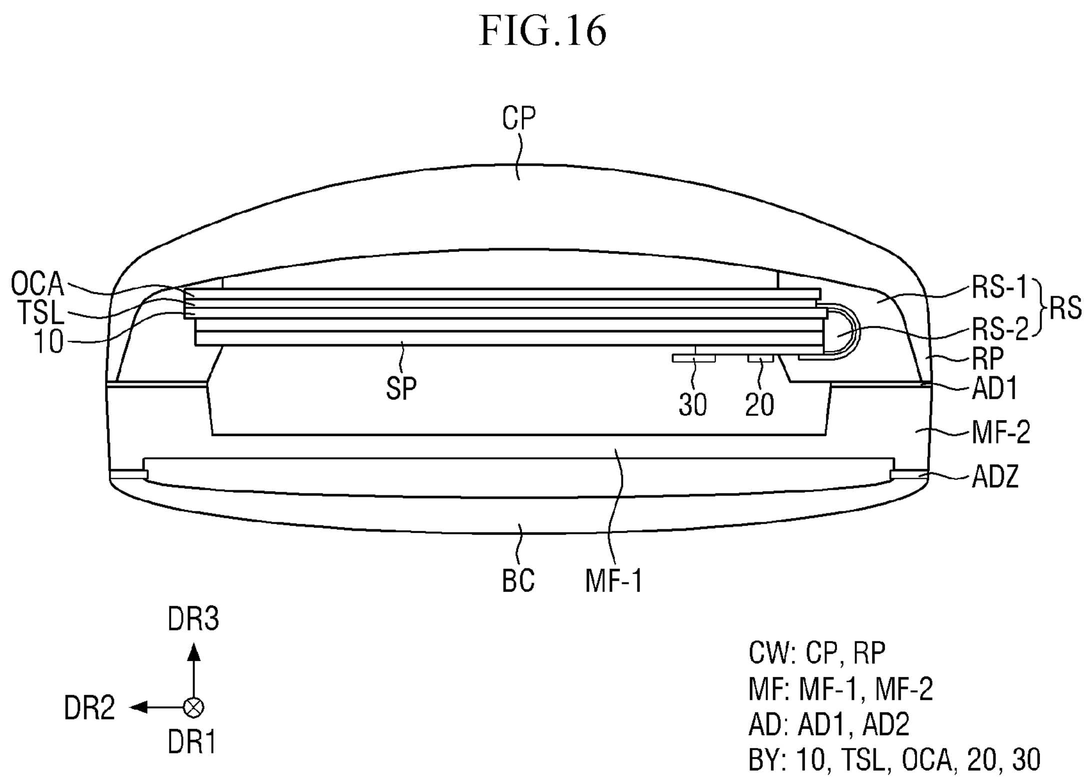

FIGS. 15 and 16 are cross-sectional views of a display device according to still another embodiment.

A display device according to embodiments of FIGS. 15 and 16 is different from the display device according to the embodiments described above in that the cover window CW has a dome shape that is convex in the third direction DR3 in cross section. Hereinafter, differences from the embodiments described above will be mainly described with reference to FIGS. 15 and 16.

The cover window CW may have a circular shape, an elliptical shape, or a polygonal shape in a plan view. The cover window CW may have a convex shape in the first direction DR1 in cross section.

The cover window CW may have a dome shape. An outer surface of the dome shape of the cover window CW may be a curved surface that is convex in the third direction DR3. The outer surface of the dome shape of the cover window CW may be a spherical surface or an aspheric surface.

The outer surface of the dome shape of the cover window CW may have a circular or elliptical shape on a plane defined by the second and third directions DR2 and DR3. The outer surface of the dome shape of the cover window CW may have a curved shape on a cross section defined by the first and second directions DR2 and DR3 or a cross section defined by the first and third directions DR1 and DR3. The outer surface of the dome shape of the cover window CW has a shape that is convex in the third direction DR3 on all cross-sections.

An inner surface of the dome shape of the cover window CW may have the same or different shape as the outer surface. For example, when the inner surface of the dome shape of the cover window CW has the same shape as the outer surface thereof, the cover window CW may have a dome shape having a uniform thickness. Alternatively, when the inner surface of the dome shape of the cover window CW has a shape different from a shape of the outer surface, the cover window CW may have a dome shape having a non-uniform thickness.

In an embodiment, as the cover window CW has the dome shape, a space may be formed between the cover window CW and the body portion BY. In another embodiment, as the cover window CW has the dome shape, the body portions BY coupled to the cover window CW may be attached along the inner surface of the cover window CW to have surfaces corresponding to the inner surface of the cover window CW.

The display device according to the embodiment described above may sufficiently secure an attachment area between the cover window and the middle frame while reducing the width of the bending area of the cover window.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:

1. A display device comprising:

a display member;

a cover window covering an upper portion of the display member and having a central portion and a curved portion;

a lower cover covering a lower portion of the display member;

a middle frame disposed between the cover window and the lower cover;

a first coupling layer disposed between the curved portion of the cover window and the middle frame and made of an adhesive material; and a first filler filled in a space between the curved portion of the cover window and the display member, wherein at least a portion of the first coupling layer and the first filler overlap in a thickness direction of the display member.

2. The display device of claim 1, wherein the curved portion becomes thinner as a distance from the central portion increases.

3. The display device of claim 2, wherein a slope of an outer wall of the curved portion is steeper than a slope of an inner wall.

4. The display device of claim 2, wherein the first coupling layer includes a first_first coupling layer in contact with the curved portion and a first_second coupling layer that is not in contact with the curved portion.

5. The display device of claim 4, wherein the middle frame, the first_second coupling layer, the first filler, and the cover window overlap in the thickness direction.

6. The display device of claim 5, wherein the first filler is in contact with the first_second coupling layer, the cover window, and a side surface of the display member.

7. The display device of claim 6, wherein the first filler is made of resin.

8. The display device of claim 6, wherein a thickness of the first filler is smaller than a height of an inner side of the cover window.

9. The display device of claim 1, wherein the display member includes a display panel on which an image is displayed, and the display panel includes a bending area in which the display panel is bent.

10. The display device of claim 9, wherein a space the bending area of the display panel surrounds is filled with a second filler.

11. The display device of claim 10, wherein the second filler is formed of a same material as the first filler.

12. The display device of claim 11, wherein the second filler is made of resin.

13. The display device of claim 9, wherein the middle frame includes a middle plate disposed on a rear surface of the display panel, and a middle sidewall coupled to a side surface of the middle plate to vertically support the curved portion, and the middle frame is disposed to be spaced apart from the display panel to include an accommodating space therebetween.

14. The display device of claim 1, further comprising a second coupling layer disposed between the middle frame and the lower cover and made of an adhesive material.

15. The display device of claim 1, wherein the cover window has a dome shape that is convex in the thickness direction.

16. A display device comprising:

a display member;

a cover window covering an upper portion of the display member and having a central portion and a curved portion;

a lower cover covering a lower portion of the display member;

a middle frame disposed between the cover window and the lower cover;

a first coupling layer disposed between the curved portion of the cover window and the middle frame and made of an adhesive material; and a first filler filled in a space between the curved portion of the cover window and the display member, wherein the curved portion becomes thinner as a distance from the central portion increases.

17. The display device of claim 16, wherein a slope of an outer wall of the curved portion is steeper than a slope of an inner wall.

18. The display device of claim 17, wherein the first filler is in contact with the first coupling layer, the cover window, and a side surface of the display member.

19. The display device of claim 16, wherein the display member includes a display panel on which an image is displayed, the display panel includes a bending area in which the display panel is bent, and a space the bending area of the display panel surrounds is filled with a second filler.

20. The display device of claim 16, wherein the cover window has a dome shape that is convex in a thickness direction of the display member.

* * * * *